(12) United States Patent
Doong et al.

(10) Patent No.: US 10,096,378 B1
(45) Date of Patent: Oct. 9, 2018

(54) ON-CHIP CAPACITANCE MEASUREMENT FOR MEMORY CHARACTERIZATION VEHICLE

(71) Applicant: PDF Solutions, Inc., San Jose, CA (US)

(72) Inventors: Yih-Yuh Doong, Zhubei (TW); Chao-Hsiung Lin, Zhubei (TW); Sheng-Che Lin, BaoShan Township (TW); Shihpin Kuo, Tainan (TW); Tzupin Shen, Hsinchu (TW); Chia-Chi Lin, Hsinchu (TW); Kimon Michaels, Monte Sereno, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 50 days.

(21) Appl. No.: 15/441,002

(22) Filed: Feb. 23, 2017

(51) Int. Cl.
*G11C 29/00* (2006.01)
*G11C 29/02* (2006.01)
*H03K 17/687* (2006.01)
*G11C 8/08* (2006.01)

(52) U.S. Cl.
CPC .............. *G11C 29/028* (2013.01); *G11C 8/08* (2013.01); *H03K 17/6872* (2013.01)

(58) Field of Classification Search
CPC ..... G11C 29/028; G11C 8/08; H03K 17/6872
See application file for complete search history.

(56) References Cited

U.S. PATENT DOCUMENTS

| | | | | |
|---|---|---|---|---|
| 5,012,472 A | * | 4/1991 | Arimoto | G06F 11/1008 714/754 |
| 6,876,208 B2 | * | 4/2005 | Kunikiyo | H01L 21/823807 257/48 |
| 7,551,415 B2 | * | 6/2009 | Tsai | G11C 17/18 361/111 |
| 8,027,218 B2 | * | 9/2011 | Sutardja | G06F 9/3804 365/230.06 |
| 8,102,018 B2 | * | 1/2012 | Bertin | B82Y 10/00 257/209 |
| 8,605,523 B2 | * | 12/2013 | Tao | G11C 29/50012 365/149 |
| 8,645,878 B1 | * | 2/2014 | Clark | G06F 17/505 716/51 |
| 2009/0115468 A1 | * | 5/2009 | Berthold | H03K 3/356156 327/141 |
| 2017/0345509 A1 | * | 11/2017 | Tran | G11C 7/065 |

* cited by examiner

*Primary Examiner* — Naum B Levin
(74) *Attorney, Agent, or Firm* — Pillsbury Winthrop Shaw Pittman LLP

(57) ABSTRACT

A capacitance measurement test vehicle comprises multiple product layers which are used to build memories except interconnect layers, and one or more customized interconnect layers to connect memory-bit-line-under-tests (MBLUTs), memory-world-line-under-tests (MWLUTs) and memory-bit-cell-under-tests (MUTs). By introducing two transistors, one PMOS and one NMOS, at two opposite sides or the same side of a bit-line or a world-line, the capacitance of the bit-line or the world-line can be measured by a parametric tester. The PMOS device is for pumping in current, and the NMOS device is for draining out the current. By applying a non-overlapping clocked signal at the PMOS and NMOS transistors, the capacitance of bit-line, word-line and bit-cell can be measured as current signal. The PMOS and NMOS transistors are selected from on-chip transistors that are already in the memory design layout.

22 Claims, 12 Drawing Sheets

ON-CHIP CAPACITANCE MEASUREMENT FOR MEMORY CHARACTERIZATION VEHICLE

BACKGROUND

Technical Field

The disclosure relates to designing and fabricating a capacitance measurement test vehicle for specific volatile or non-volatile memory architectures.

Brief Description of the Prior Art

For memory device characterization, usually a dedicated test wafer is used, that requires a separate layout for fabricating the test structures, i.e. the layout is different from the real product layout. If test structures are built into the same wafer where the memory cells are in the real product, then to accommodate the difference between the test structures and the real product, the process flow becomes more complicated, and the process time becomes longer than usual. Also, though there are various test vehicles available for memory bit-cell characterization, most of the prior art are focused on full process flow combined with a bit-map centric debug. Existing bit-cell characterization methods only give pass/fail results without the detection of specific failure mode. Additionally, existing memory device characterization methods do not incorporate built-in measurement capability for both bit-line capacitance and word-line capacitance, as well as memory bit-cell capacitance.

SUMMARY

The present disclosure describes a test chip that includes transistor structures that allows parametric testing of bit-line and word-lines in memory cells. The parametric testing, including capacitance measurement of bit-line, word-line, and bit-cell, may be used for failure mode characterization, among other things. The transistors enabling parametric testing are on-chip, either selected from the design layout of an actual memory cell product, or, intentionally designed to be incorporated into the memory cell product layout. The transistors may have been incorporated in the design layout already for various functionalities, such as word-line driver, bit-line pre-amplifier, row/column decoder etc. The test vehicle can work for various memory cells architectures, while introducing minimal disruption in the process flow for decoding.

In one aspect, a memory-specific implementation of a test and characterization vehicle based on capacitance measurement is disclosed, utilizing a design layout that is a modified version of the product mask. Specific routing is used to modify the product mask in order to facilitate word line, bit-line and memory cell characterization. This approach can be applied to any memory architecture with word-line and bit-line, including but not limited to, volatile memories such as Static Random Access Memory (SRAM), Dynamic RAM (DRAM), non-volatile memory such as NAND Flash (including three-dimensional NAND Flash), NOR Flash, Phase-change RAM (PRAM), Ferroelectric RAM (FeRAM), Correlated electron RAM (CeRAM), Magnetic RAM (MRAM), Resistive RAM (RRAM), X-Point memory and the like.

In a further aspect, the test vehicle comprises multiple product layers which are used to build memories except interconnect layers and one or more customized interconnect layers to connect memory-bit-line-under-tests (MBLUTs), memory-world-line-under-tests (MWLUTs) and memory-bit-cell-under-tests (MUTs). In some memory architectures, for example, in DRAM, the capacitance of bit-cell can be extracted by adjusting word-line state. By introducing two transistors at two opposite sides (or on the same side) of a bit-line or a world-line, the capacitance of the bit-line or the world-line can be measured by a parametric tester. One of the transistors is a positive-channel metal oxide semiconductor (PMOS) for pumping in current, and the other transistor is a negative-channel metal oxide semiconductor (NMOS) for draining out the current. By applying a non-overlapping clocked signal at the PMOS and NMOS transistors, the capacitance of bit-line, word-line and bit-cell can be measured as current signal. The PMOS and NMOS transistors are selected from on-chip transistors that are already in the memory design layout.

The advantages of this approach includes, but are not limited to, compatibility to short process flow, ability to skip additional process flow for decoding, ability to perform current-voltage (I-V) measurement in addition to indicating pass/fail results, ability to pinpoint failure site location, and detection of specific failure mode.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION OF THE EMBODIMENTS

Embodiments of the present disclosure will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

A test vehicle comprises multiple product layers which are used to build transistors (except original interconnect layers that are removed) and one or more Customized Interconnect Layers (CILs), which can be used connect memory-bit-line-under-tests (MBLUTs), memory-world-line-under-tests (MWLUTs) and memory-bit-cell-under-tests (MUTs). The memory bit-cells within the product can be connected to probe pads for current-voltage (I-V) or special failure mode characterization by CILs. Two transistors are introduced at two opposite sides of the bit-lines and word-lines. This way the parametric test vehicle can measure bit-line capacitance and word-line capacitance in addition to bit-cell capacitance. One of the transistors is a PMOS for pumping in current, and the other is an NMOS for draining out the current. Non-overlapping clock signals are applied to the PMOS and the NMOS to measure bit-line, word-line and bit-cell capacitance. As discussed above, the PMOS and NMOS transistors are selected from on-chip transistors, i.e. transistors that are already in the design layout of the memory circuit, rather than additional transistors introduced only for test and characterization purposes.

Figure 1A:
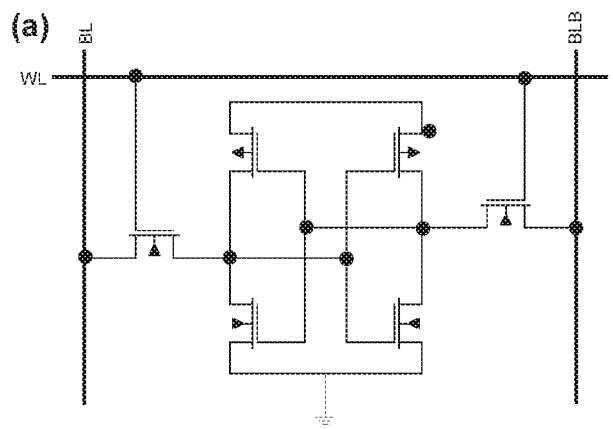
FIG. 1(a) illustrates schematic of SRAM bit-cell.
Figure 1B:
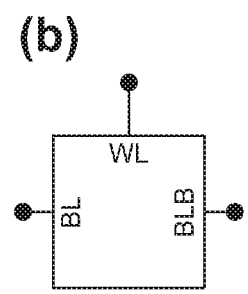
FIG. 1(b) illustrates an SRAM bit-cell symbol; and, FIG. 1(c) illustrates schematic of an SRAM array using the SRAM bit-cell symbol.
Figure 1C:
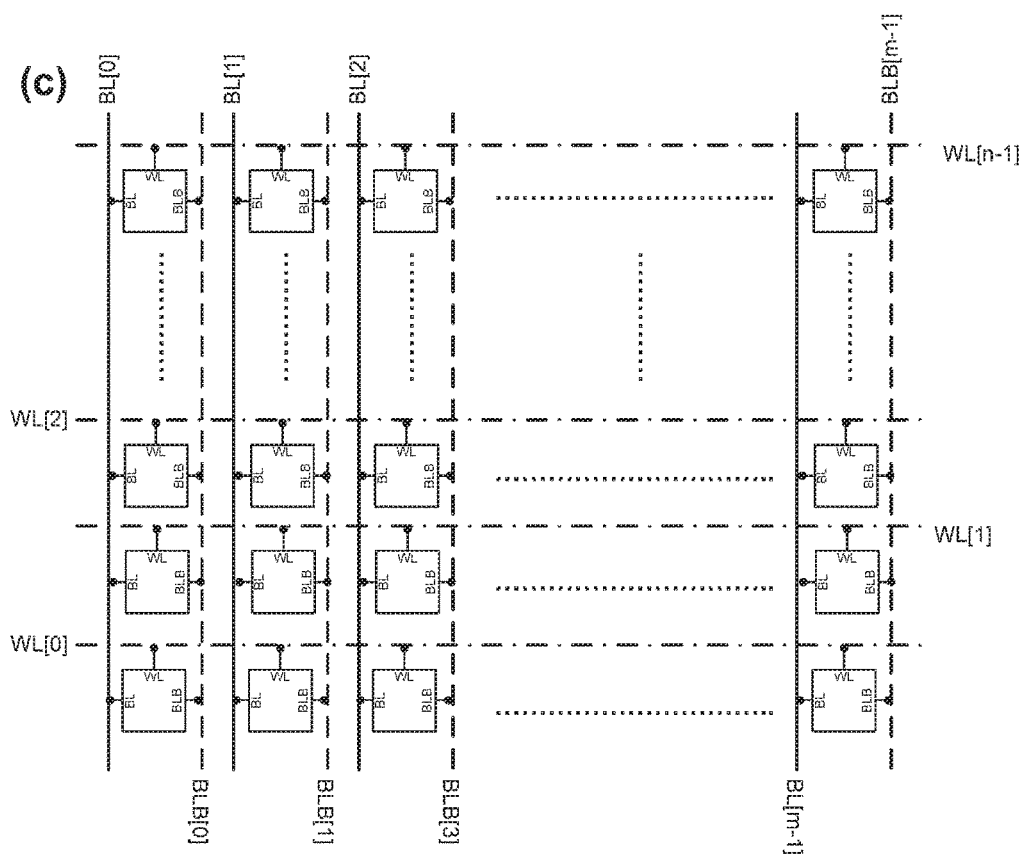
Figure 2:
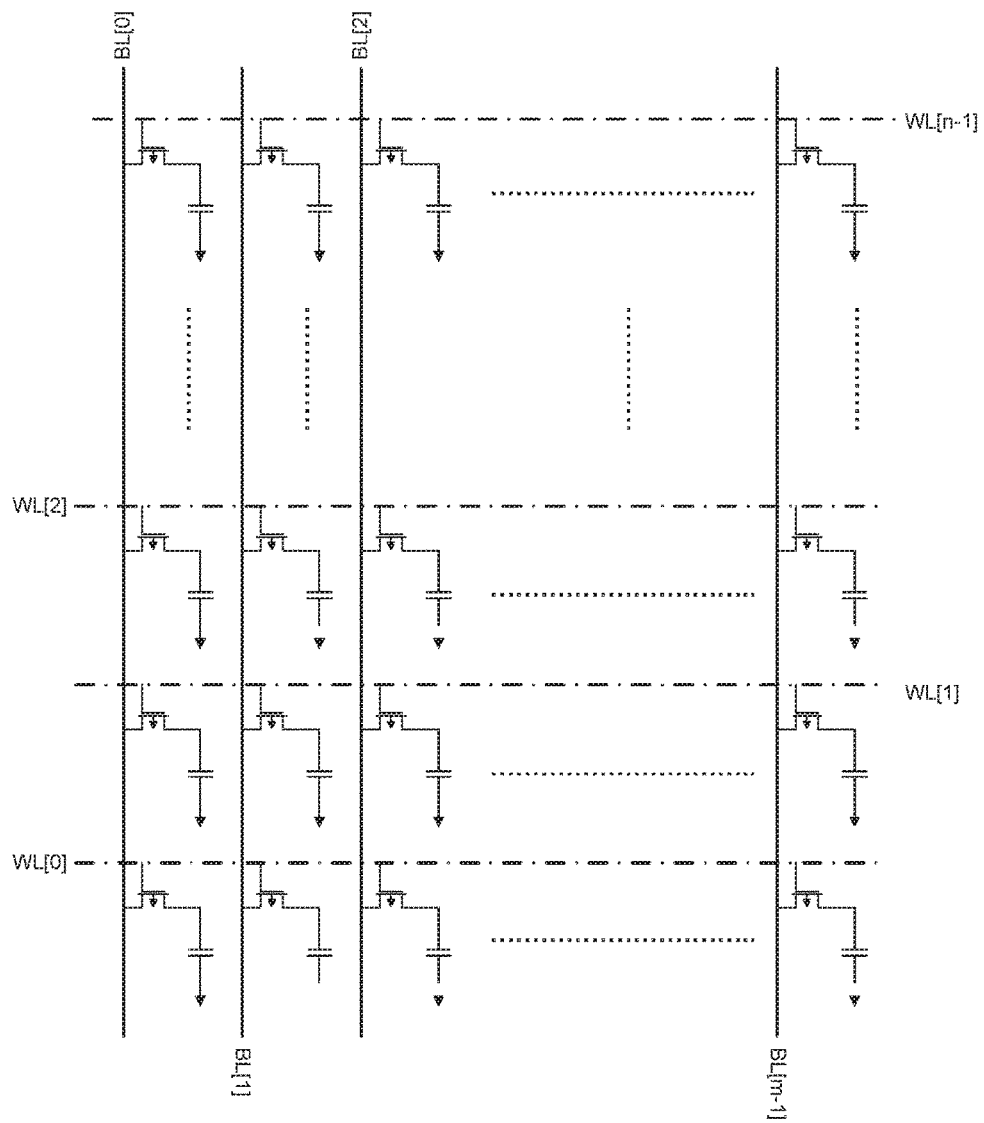
FIG. 2 illustrates schematic of a DRAM array.
Figure 3:
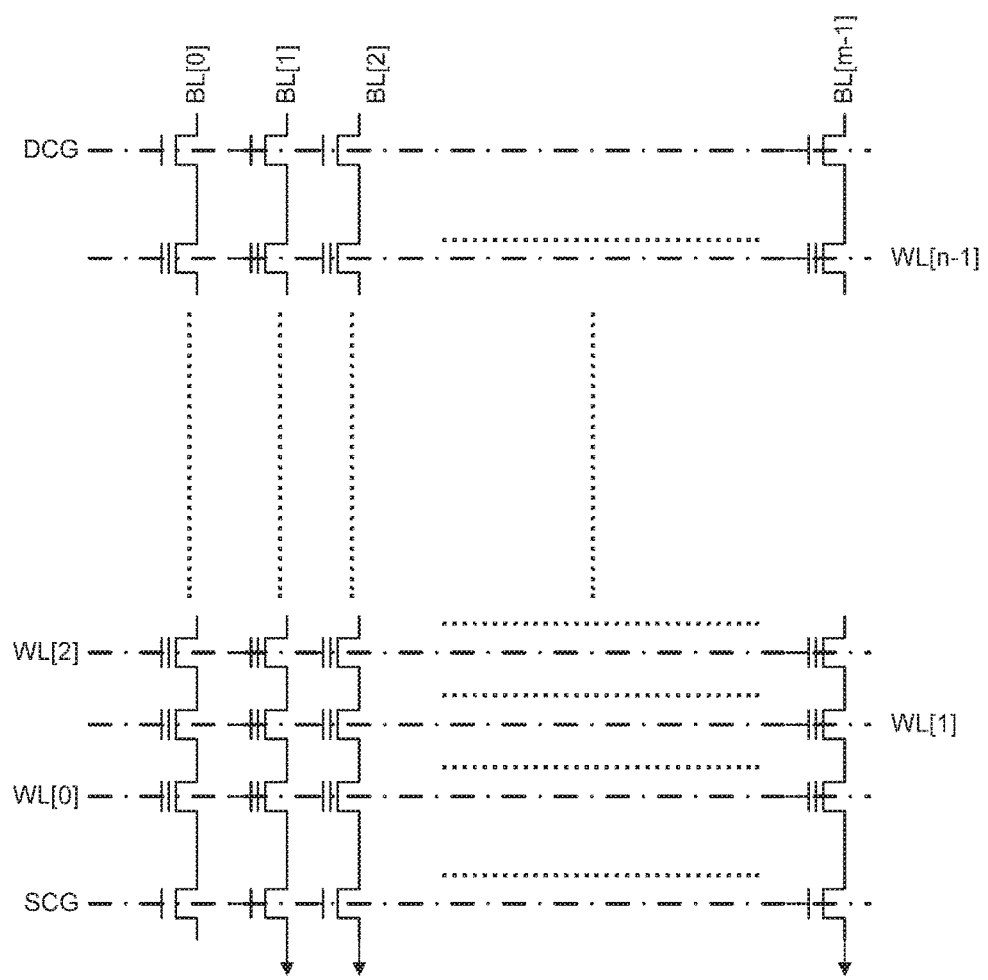
FIG. 3 illustrates schematic of a NAND array.
Figure 4:
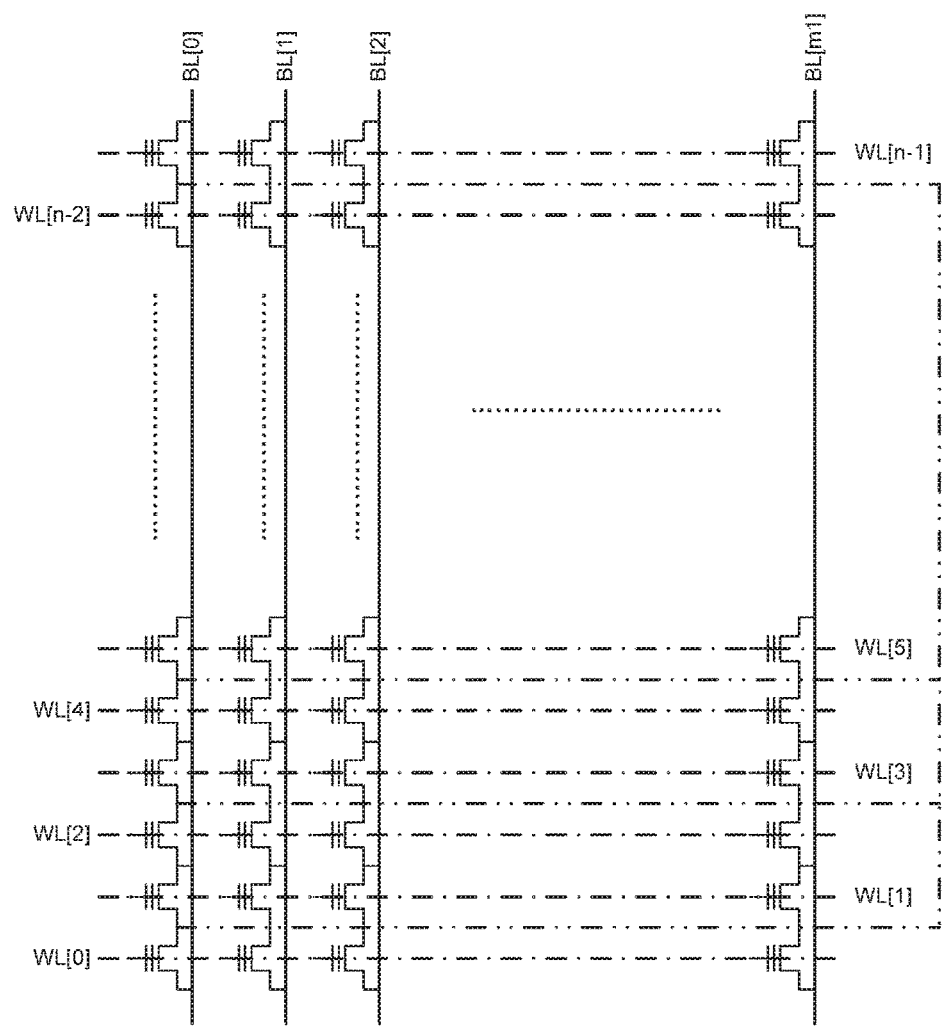
FIG. 4 illustrates schematic of a NOR array.
Figure 5:
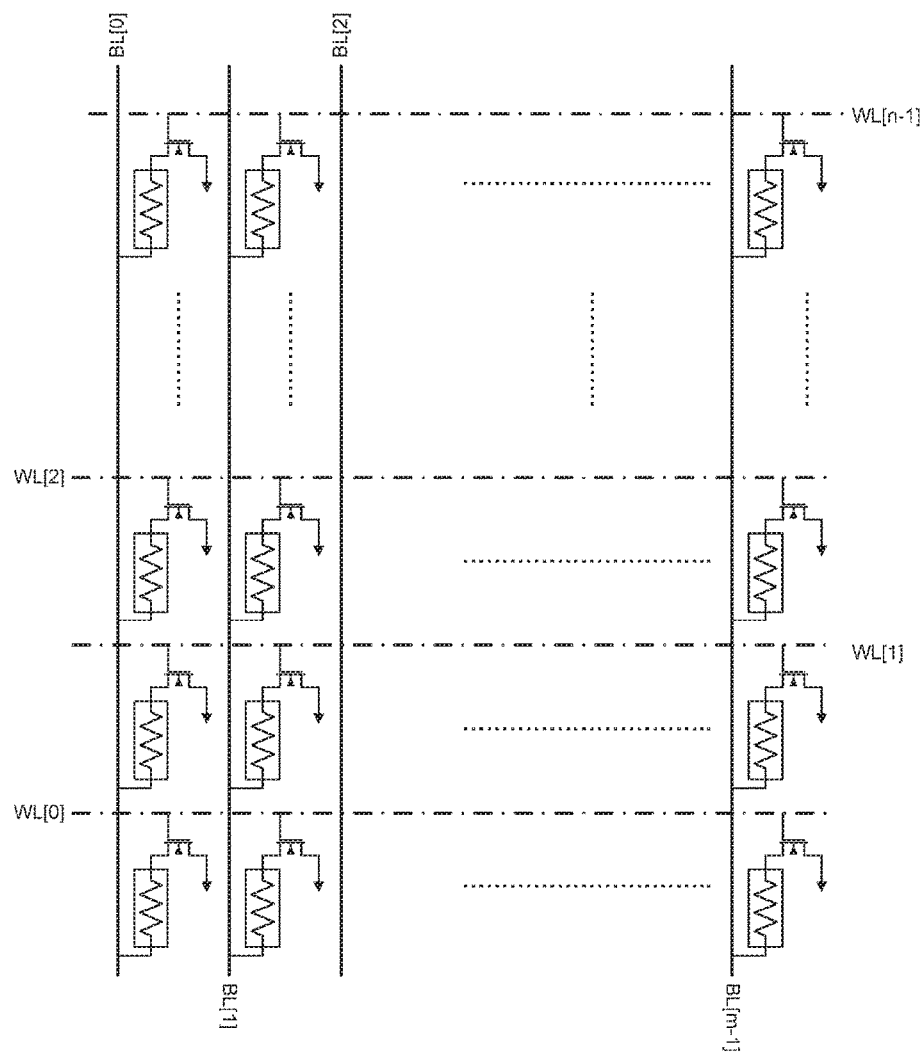
FIG. 5 illustrates schematic of an RRAM array that can be applied to any memory configuration with a resistor and a transistor per cell, such as FeRAM, CeRAM, MRAM etc.
Figure 6:
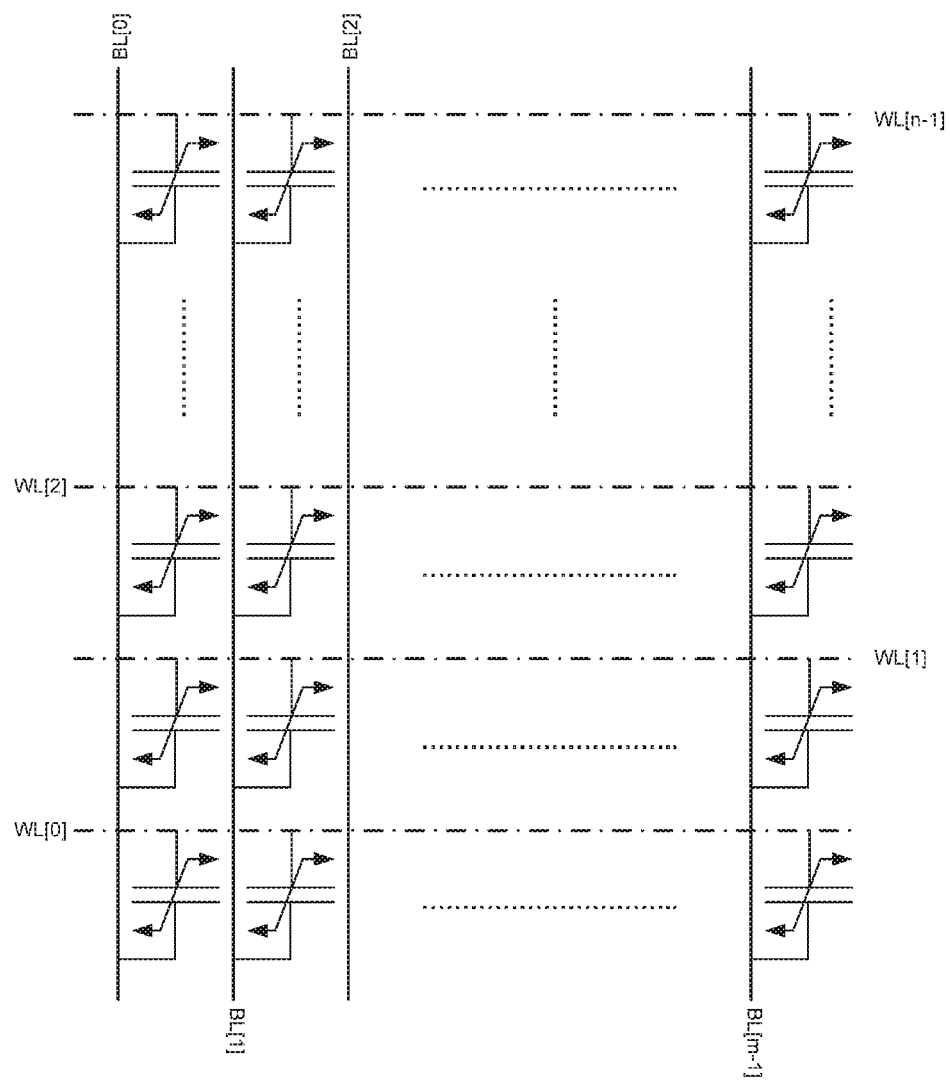
FIG. 6 illustrates schematic of an X-point array.

Table 1 specifies the voltage setting for the various type of memory during capacitance measurement. The memory types include SRAM array (FIG. 1(c)), DRAM array (FIG. 2), NAND Flash array (FIG. 3), NOR Flash array (FIG. 4), RRAM array (FIG. 5), and X-point array (FIG. 6). Note that the RRAM array configuration of FIG. 5 is applicable for any memory with one resistor and one transistor per cell, such as FeRAM, CeRAM, MRAM etc. Essentially any memory architecture, including the memory structures where word-lines and bit-lines are substantially perpendicular, can utilize the test vehicle of the current disclosure. In the figures, WL indicated word-line and BL indicates bit-line. Co-pending co-owned application, titled "Direct Access Memory Characterization Vehicle," which is incorporated herein in its entirety, describes the summary of design rules for various types of memory design.

TABLE 1

Summary of various types of memory design

| Measurement Item | | Bit-line | Word-line |
|---|---|---|---|
| SRAM | Bit-line capacitance | high | low |
| | Word-line capacitance | low | high |
| DRAM | Bit-line capacitance | high | low |
| | Word-line capacitance | low | high |
| | Cell capacitance | high | high |
| NAND Flash | Bit-line capacitance | high | low |
| | Word-line capacitance | low | high |

TABLE 1-continued

Summary of various types of memory design

| Measurement Item | | Bit-line | Word-line |
|---|---|---|---|
| NOR Flash | Bit-line capacitance | high | low |
| | Word-line capacitance | low | high |
| R-RAM | Bit-line capacitance | high | low |
| | Word-line capacitance | low | high |
| Xpoint | Bit-line capacitance | high | low |
| | Word-line capacitance | low | high |

For each type of memory shown in FIGS. 1-6, two transistors, one PMOS and one NMOS, are selected from on-chip. The transistors may have been incorporated in the design layout already for various functionalities, such as word-line driver, bit-line pre-amplifier, row/column decoder etc. The two selected transistors are routed to two sides of memory block using the customized interconnect layer (CIL) for either word-line or bit-line capacitance extraction, as illustrated in FIGS. 7(a)-(b).

Figure 7A:
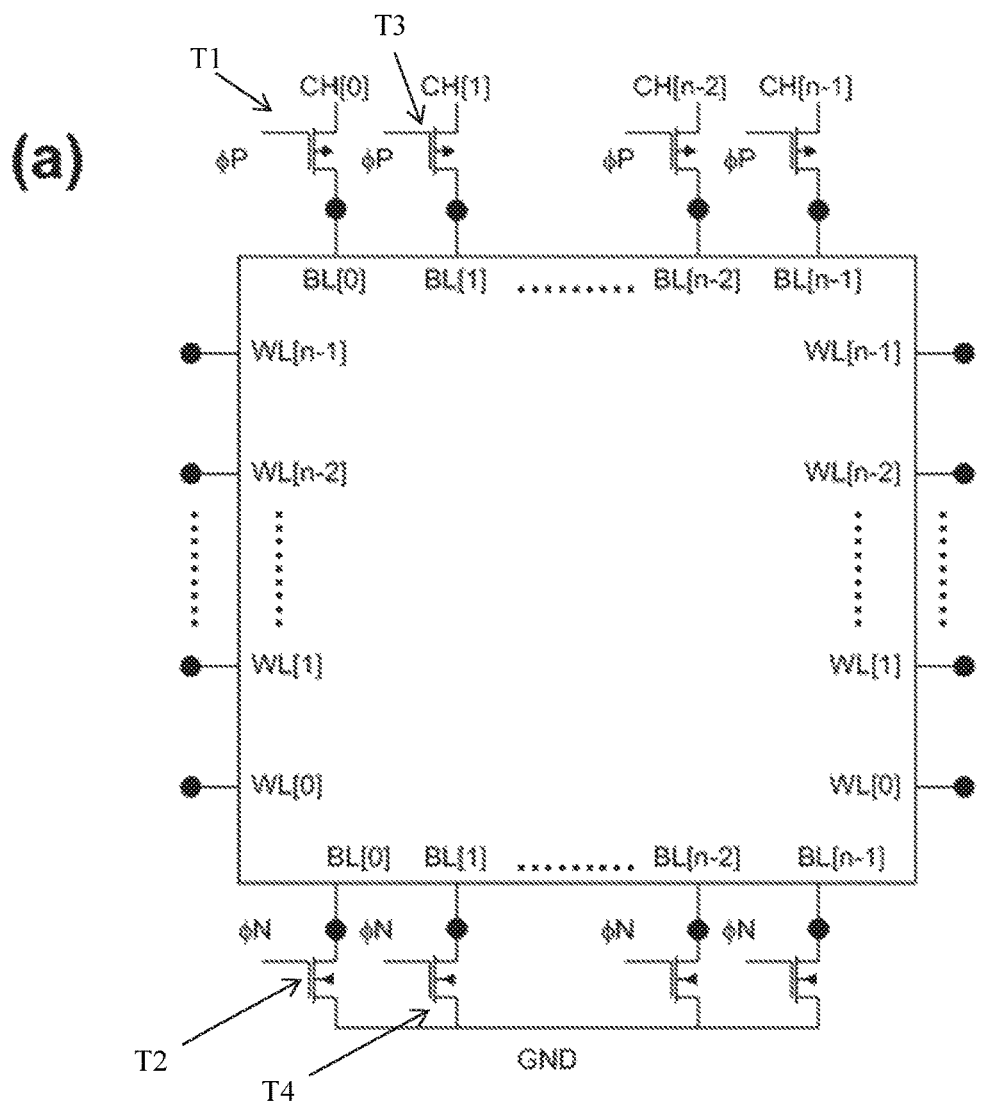
FIG. 7(a) illustrates an embodiment of a schematic memory block for a bit-line capacitance extraction with PMOS and NMOS devices on the opposite sides of a bit-line.
Figure 8:
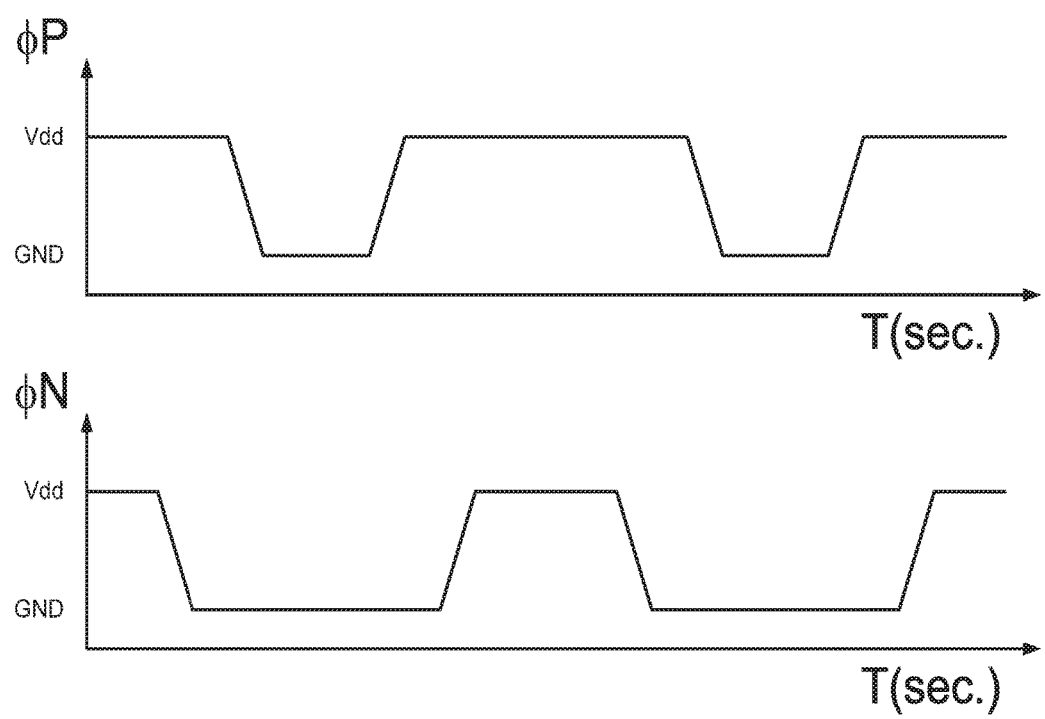
FIG. 8 illustrates timing diagrams of non-overlapping clock signals for current drained into PMOS (top diagram) and current flowing out of NMOS (bottom diagram)

Specifically, FIG. 7(a) shows bit-line capacitance extraction according to one embodiment where PMOS and NMOS transistors are connected at the opposite sides of a memory block. In this schematic, for the zero-eth bit-line (i.e. BL[0]), PMOS transistor T1 and NMOS transistor T2 are used at the opposite sides of BL[0]. By applying a non-overlapping clock signals ΦP and ΦN, as shown in FIG. 8, to the transistors T1 and T2, capacitance associated with BL[0] is measured. Similarly the capacitance of BL[1] is measured by using the transistors T3 and T4 and so on. Each of the n number of bit-lines BL[0], BL[1], . . . , BL[n−1] will have its own pair of PMOS/NMOS transistors for capacitance measurement.

Figure 7B:
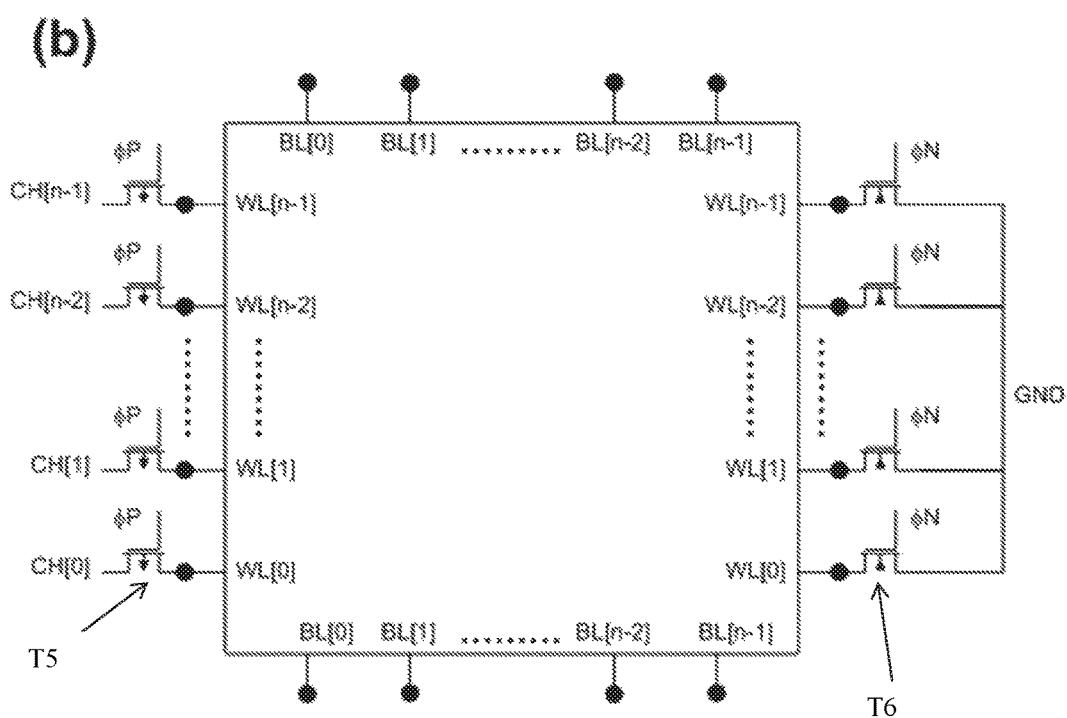
FIG. 7(b) illustrates schematic memory block for a word-line capacitance extraction with PMOS and NMOS devices on the opposite sides of a word-line.

FIG. 7(b) shows word-line capacitance extraction according to one embodiment where PMOS and NMOS transistors are connected at the opposite sides of a memory block. In this schematic, for the zero-eth word-line (i.e. WL[0]), PMOS transistor T5 and NMOS transistor T6 are used at the opposite sides of WL[0]. By applying a non-overlapping clock signals ΦP and ΦN, as shown in FIG. 8, to the transistors T5 and T6, capacitance associated with WL[0] is measured. In a similar manner, capacitances of other word-lines, such as WL[1], WL[2], . . . WL[n−1] are measured by using a transistor pair each. Note that number of bit-lines does not have tom be equal to the number of word-lines.

Either word-line or bit-line can be transformed into current drained into PMOS, and flowed out of NMOS. The current flowed through word-line or bit-line can be represented by the following equations:

$$I_{word-line}(i) = C_{word-line}(i) * V_{CC} * f \qquad \text{Equation 1}$$

$$I_{bit-line}(i) = C_{bit-line}(i) * V_{CC} * f \qquad \text{Equation 2}$$

$C_{word-line}(i)$: capacitance of $i^{th}$ word-line.
$C_{bit-line}(i)$: capacitance of $i^{th}$ bit-line
$I_{word-line}(i)$: current through $i^{th}$ word-line.
$I_{bit-line}(i)$: current through $i^{th}$ bit-line
f: frequency of two synchronized non-overlap square-wave signals.
$V_{CC}$: voltage of power supply.
i=0 to (n−1)

In some memory architectures, for example, in DRAM, the capacitance of bit-cell can be extracted by adjusting word-line state, i.e. no separate measurement is needed for bit-cell capacitance. In Equation 2, it is assumed that all of word-lines are at the off-state. Thus, the cell capacitance cannot be incorporated during measurement. If 'n' of word-lines are set to on-state, the current through bit-line can be rewritten as the following Equation 2.1:

$$I_{bit-line}(i, n) = C_{bit-line}(i) * V_{CC} * f + n * C_{cell} * V_{CC} * f = \quad \text{Equation 2.1}$$
$$(C_{bit-line}(i) + n * C_{cell}) * V_{CC} * f$$

By combining Equations 2 and 2.1, bit-line and bit-cell capacitance can be obtained by changing the number (n) of cells at on-state.

Table 2 shows the simulation result of the above-described capacitance measurement method applied in DRAM for the various conditions of bit-line capacitance and bit-cell capacitance. With the incorporation this approach, the error among ideal case versus measurement can be brought down sub-0.1%. $C_s$ in Table 2 is storage capacitance of DRAM bit-cells. $C_{BL}$ are bit-line capacitance. The numbers 4, 8, . . . 128 in the second column are number of cells at on-state. The values of Table 2 are the simulation result at various conditions of bit-cell capacitance, bit-line capacitance and n-cells at on state, as described in Equation 2.1.

Figure 9A:
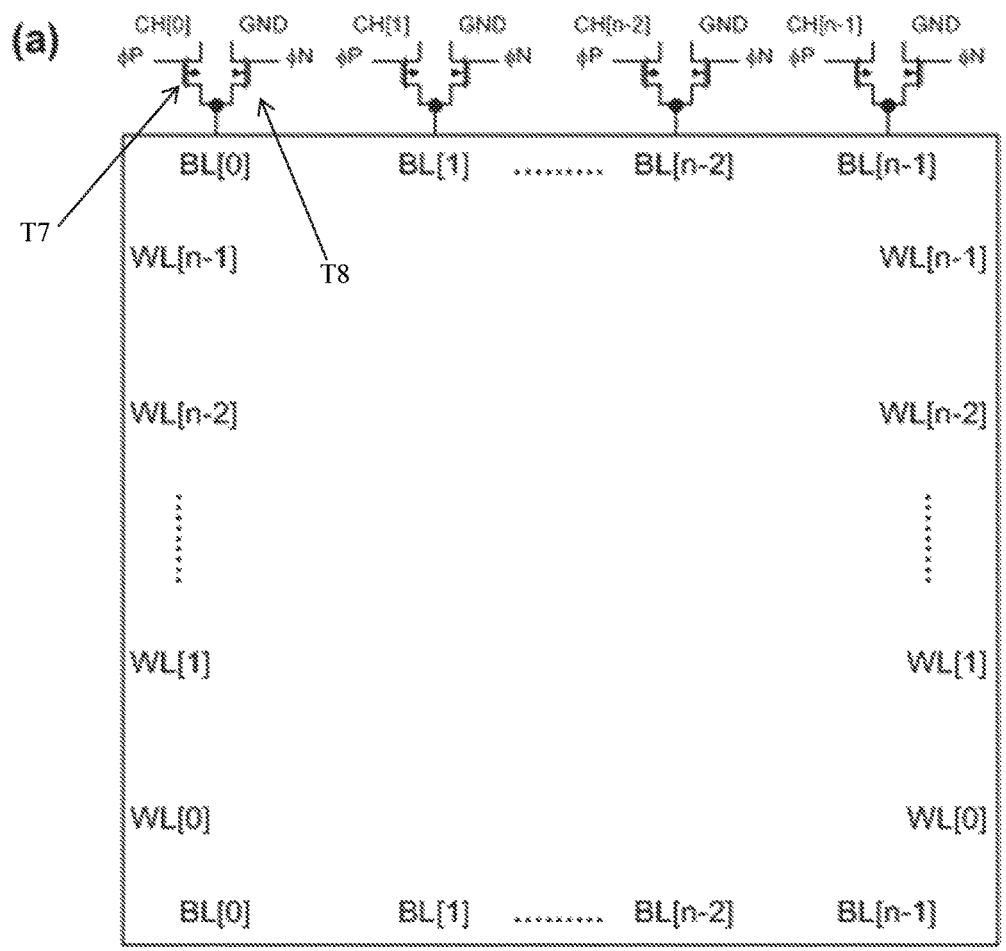
FIG. 9(a) illustrates an alternative embodiment of a schematic memory block for a bit-line capacitance extraction with PMOS and NMOS devices on the same side of a bit-line.
Figure 9B:
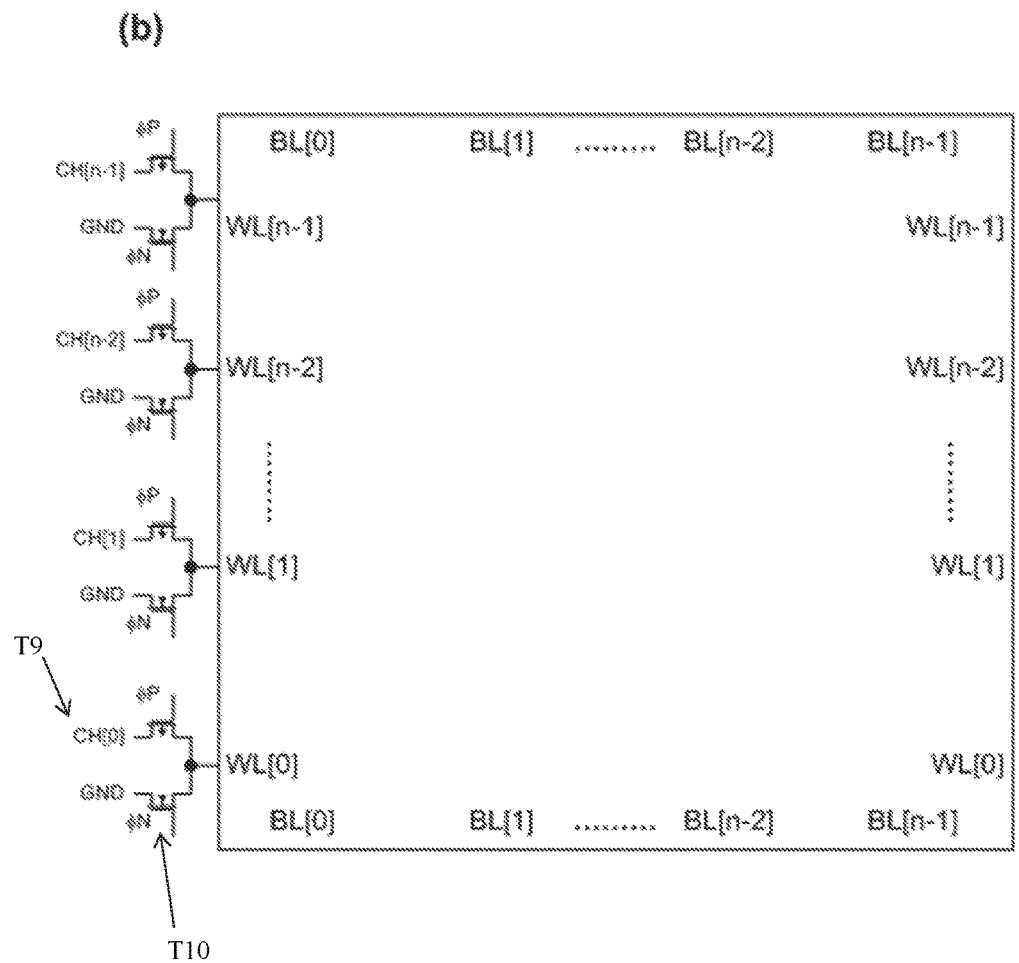
FIG. 9(b) illustrates schematic memory block for a word-line capacitance extraction with PMOS and NMOS devices on the same side of a word-line.

Though FIGS. 7(a) and 7(b) show that the PMOS and the NMOS transistors are connected at opposite sides of a memory clock, FIG. 9(a)-(b) illustrate an alternative embodiment where PMOS and NMOs transistors connected at the same side of the memory block. Specifically, FIG. 9(a) illustrates a schematic memory block for a bit-line capacitance extraction with PMOS device T7 and NMOS device T8 on the same side of a bit-line BL[0]; and FIG. 9(b) illustrates a schematic memory block for a word-line capacitance extraction with PMOS device T9 and NMOS device T10 on the same side of a word-line WL[0].

This disclosure in general relates to hardware and/or software-based methods of product characterization, new testing techniques (e.g., improvements to tester efficacy or throughput), and, use of a known test structure for a novel purpose, such as implementation of software for design of experiments (DOEs), including choosing structures for filler cells for novel production control purposes. The disclosure directly impacts e-metrology and production control. By using this disclosure, technology development can be performed at memory array process to save cycle time.

The disclosure has been described in terms of particular embodiments. Other embodiments are within the scope of the following claims. For example, the steps of the disclosure can be performed in a different order and still achieve desirable results. While certain representative embodiments and details have been shown for purposes of illustrating the disclosure, it will be apparent to those skilled in the art that various changes in the methods and apparatus disclosed herein may be made without departing from the scope of the disclosure which is defined in the appended claims.

TABLE 2

Simulation results of capacitance measurement test vehicle applied in DRAM

| $C_S$ (fF) | In Parallel | Simulation $C_{BL}$ (fF) | | | Ideal $C_{BL}$ (fF) | | | Error (%) $C_{BL}$ (fF) | | |
|---|---|---|---|---|---|---|---|---|---|---|
| | | 20 | 40 | 60 | 20 | 40 | 60 | 20 | 40 | 60 |
| 18 | 4 | 92.065 | 112.07 | 132.07 | 92 | 112 | 132 | 0.07% | 0.06% | 0.05% |
| | 8 | 164.07 | 184.07 | 204.07 | 164 | 184 | 204 | 0.04% | 0.04% | 0.03% |
| | 16 | 308.06 | 328.07 | 348.07 | 308 | 328 | 348 | 0.02% | 0.02% | 0.02% |
| | 32 | 596.07 | 616.07 | 636.07 | 596 | 616 | 636 | 0.01% | 0.01% | 0.01% |
| | 64 | 1172.1 | 1192.1 | 1212.1 | 1172 | 1192 | 1212 | 0.01% | 0.01% | 0.01% |
| | 128 | 2324 | 2344 | 2364 | 2324 | 2344 | 2364 | 0.00% | 0.00% | 0.00% |
| 20 | 4 | 100.07 | 120.07 | 140.07 | 100 | 120 | 140 | 0.07% | 0.06% | 0.05% |
| | 8 | 180.07 | 200.07 | 220.07 | 180 | 200 | 220 | 0.04% | 0.03% | 0.03% |
| | 16 | 340.06 | 360.07 | 380.07 | 340 | 360 | 380 | 0.02% | 0.02% | 0.02% |
| | 32 | 660.07 | 680.07 | 700.07 | 660 | 680 | 700 | 0.01% | 0.01% | 0.01% |
| | 64 | 1300.1 | 1320.1 | 1340.1 | 1300 | 1320 | 1340 | 0.01% | 0.01% | 0.01% |
| | 128 | 2580 | 2600 | 2620 | 2580 | 2600 | 2620 | 0.00% | 0.00% | 0.00% |
| 22 | 4 | 108.07 | 128.07 | 148.07 | 108 | 128 | 148 | 0.06% | 0.05% | 0.05% |
| | 8 | 196.06 | 216.07 | 236.07 | 196 | 216 | 236 | 0.03% | 0.03% | 0.03% |
| | 16 | 372.07 | 392.07 | 412.07 | 372 | 392 | 412 | 0.02% | 0.02% | 0.02% |
| | 32 | 724.07 | 744.07 | 764.07 | 724 | 744 | 764 | 0.01% | 0.01% | 0.01% |
| | 64 | 1428.1 | 1448.1 | 1468.1 | 1428 | 1448 | 1468 | 0.01% | 0.01% | 0.01% |
| | 128 | 2835.8 | 2855.8 | 2875.8 | 2836 | 2856 | 2876 | −0.01% | −0.01% | −0.01% |
| 24 | 4 | 116.07 | 136.07 | 156.07 | 116 | 136 | 156 | 0.06% | 0.05% | 0.04% |
| | 8 | 212.06 | 232.07 | 252.07 | 212 | 232 | 252 | 0.03% | 0.03% | 0.03% |
| | 16 | 404.07 | 424.07 | 444.07 | 404 | 424 | 444 | 0.02% | 0.02% | 0.02% |
| | 32 | 788.07 | 808.07 | 828.07 | 788 | 808 | 828 | 0.01% | 0.01% | 0.01% |
| | 64 | 1556.1 | 1576.1 | 1596.1 | 1556 | 1576 | 1596 | 0.01% | 0.01% | 0.01% |
| | 128 | 3091.3 | 3111.3 | 3131.3 | 3092 | 3112 | 3132 | −0.02% | −0.02% | −0.02% |
| 26 | 4 | 124.07 | 144.07 | 164.07 | 124 | 144 | 164 | 0.06% | 0.05% | 0.04% |
| | 8 | 228.06 | 248.07 | 268.07 | 228 | 248 | 268 | 0.03% | 0.03% | 0.03% |
| | 16 | 436.07 | 456.07 | 476.07 | 436 | 456 | 476 | 0.02% | 0.02% | 0.01% |
| | 32 | 852.06 | 872.07 | 892.07 | 852 | 872 | 892 | 0.01% | 0.01% | 0.01% |
| | 64 | 1684.1 | 1704.1 | 1724.1 | 1684 | 1704 | 1724 | 0.01% | 0.01% | 0.01% |
| | 128 | 3346.4 | 3366.4 | 3386.4 | 3348 | 3368 | 3388 | −0.05% | −0.05% | −0.05% |

The invention claimed is:

1. A method for designing a parametric test vehicle for bit-line capacitance measurement utilizing a layout of a memory chip comprising a plurality of bit-lines addressing a plurality of memory bit-cells in a memory block, the method comprising:
   importing a layout of the memory chip;
   selecting a first pair of transistors, comprising a first PMOS transistor and a first NMOS transistor, from the layout of the memory chip;

removing existing routing interconnect for the selected first PMOS transistor and the first NMOS transistor;
creating customized interconnect layers (CIL) to connect the first PMOS transistor to one end of a bit-line at one side of the memory block, and, to connect the first NMOS transistor to the same end or a different end of the same bit-line;
driving the PMOS transistor with a first clock signal, and driving the NMOS transistor with a second clock signal, wherein the first clock signal and the second clock signal are synchronized but non-overlapping;
measuring current flowing through the bit-line to calculate a capacitance of the bit-line; and
incorporating the selected PMOS and NMOS transistors with the CIL into the layout of the memory chip to create a modified memory chip layout, such that a wafer fabricated using the modified memory chip layout comprises a memory chip with a built-in test vehicle for capacitance measurement.

2. The method of claim 1, wherein the first PMOS and the first NMOS transistors are connected at the same end of a bit-line on the same side of the memory block.

3. The method of claim 1, wherein the first PMOS and the first NMOS transistors are connected at different ends of a bit-line on opposite sides of the memory block.

4. The method of claim 1, wherein the memory array comprises volatile memory array comprising SRAM or DRAM.

5. The method of claim 1, wherein the memory array comprises a non-volatile memory array comprising one of: NAND Flash, NOR Flash, MRAM, RRAM, PRAM, FeRAM, CeRAM, and X-point.

6. The method of claim 1, wherein the memory chip further comprises a plurality of word-lines addressing the plurality of memory bit-cells in the memory block, and wherein the method further comprises:
selecting a second pair of transistors, comprising a second PMOS transistor and a second NMOS transistor, from the layout of the memory chip;
removing existing routing interconnect for the selected second PMOS transistor and the second NMOS transistor;
creating routing paths within the CIL to connect the second PMOS transistor to one end of a word-line at a side of the memory block, and, to connect the second NMOS transistor to the same end or a different end of the same word-line;
driving the second PMOS transistor with a third clock signal, and driving the second NMOS transistor with a fourth clock signal, wherein the third clock signal and the fourth clock signal are synchronized but non-overlapping;
measuring current flowing through the word-line to calculate a capacitance of the word-line; and
incorporating the selected second PMOS and second NMOS transistors with the routing paths within the CIL into the modified layout of the memory chip, so that the built-in test vehicle can measure both bit-line and word-line capacitance.

7. The method of claim 6, wherein the third clock signal and the fourth clock signals are identical to the first clock signal and the second clock signal respectively.

8. The method of claim 6, wherein a capacitance of a memory bit-cell is calculated by changing word-line state without having to independently measure bit-cell capacitance.

9. The method of claim 6, wherein the bit-lines and the word-lines are substantially perpendicular to one another.

10. The method of claim 1, wherein the first PMOS transistor and the first NMOS transistor are selected from on-chip circuitry for the memory block.

11. The method of claim 10, wherein the on-chip circuitry is for one of: word-line driver, bit-line pre-amplifier, row/column decoder.

12. A method for designing a parametric test vehicle for word-line capacitance measurement utilizing a layout of a memory chip comprising a plurality of word-lines addressing a plurality of memory bit-cells in a memory block, the method comprising:
importing a layout of the memory chip;
selecting a first pair of transistors, comprising a first PMOS transistor and a first NMOS transistor, from the layout of the memory chip;
removing existing routing interconnect for the selected first PMOS transistor and the first NMOS transistor;
creating customized interconnect layers (CIL) to connect the first PMOS transistor to one end of a word-line at one side of the memory block, and, to connect the first NMOS transistor to the same end or a different end of the same word-line;
driving the PMOS transistor with a first clock signal, and driving the NMOS transistor with a second clock signal, wherein the first clock signal and the second clock signal are synchronized but non-overlapping;
measuring current flowing through the word-line to calculate a capacitance of the word-line; and
incorporating the selected PMOS and NMOS transistors with the CIL into the layout of the memory chip to create a modified memory chip layout, such that a wafer fabricated using the modified memory chip layout comprises a memory chip with a built-in test vehicle for capacitance measurement.

13. The method of claim 12, wherein the first PMOS and the first NMOS transistors are connected at the same end of a bit-line on the same side of the memory block.

14. The method of claim 12, wherein the first PMOS and the first NMOS transistors are connected at different ends of a bit-line on opposite sides of the memory block.

15. The method of claim 12, wherein the memory array comprises volatile memory array comprising SRAM or DRAM.

16. The method of claim 12, wherein the memory array comprises a non-volatile memory array comprising one of: NAND Flash, NOR Flash, MRAM, RRAM, PRAM, FeRAM, CeRAM, and X-point.

17. The method of claim 12, wherein the memory chip further comprises a plurality of bit-lines addressing the plurality of memory bit-cells in the memory block, and wherein the method further comprises:
selecting a second pair of transistors, comprising a second PMOS transistor and a second NMOS transistor, from the layout of the memory chip;
removing existing routing interconnect for the selected second PMOS transistor and the second NMOS transistor;
creating routing paths within the CIL to connect the second PMOS transistor to one end of a bit-line at a side of the memory block, and, to connect the second NMOS transistor to the same end or a different end of the same bit-line;
driving the second PMOS transistor with a third clock signal, and driving the second NMOS transistor with a fourth clock signal, wherein the third clock signal and the fourth clock signal are synchronized but non-overlapping;

measuring current flowing through the word-line to calculate a capacitance of the bit-line; and incorporating the selected second PMOS and second NMOS transistors with the routing paths within the CIL into the modified layout of the memory chip, so that the built-in test vehicle can measure both bit-line and word-line capacitance.

18. The method of claim 17, wherein the third clock signal and the fourth clock signals are identical to the first clock signal and the second clock signal respectively.

19. The method of claim 17, wherein a capacitance of a memory bit-cell is calculated by changing word-line state without having to independently measure bit-cell capacitance.

20. The method of claim 17, wherein the bit-lines and the word-lines are substantially perpendicular to one another.

21. The method of claim 12, wherein the first PMOS transistor and the first NMOS transistor are selected from on-chip circuitry for the memory block.

22. The method of claim 21, wherein the on-chip circuitry is for one of: word-line driver, bit-line pre-amplifier, row/column decoder.

* * * * *